(12) United States Patent
Gore et al.

(10) Patent No.: US 6,903,175 B2
(45) Date of Patent: Jun. 7, 2005

(54) POLYMER SYNTHESIS AND FILMS THEREFROM

(75) Inventors: Robert H. Gore, Southampton, PA (US); Michael K. Gallagher, Lansdale, PA (US); Yujian You, Lansdale, PA (US)

(73) Assignee: Shipley Company, L.L.C., Marlborough, MA (US)

( * ) Notice: Subject to any disclaimer, the term of this patent is extended or adjusted under 35 U.S.C. 154(b) by 2 days.

(21) Appl. No.: 09/960,662

(22) Filed: Sep. 22, 2001

(65) Prior Publication Data

US 2003/0008989 A1 Jan. 9, 2003

Related U.S. Application Data

(60) Provisional application No. 60/278,904, filed on Mar. 26, 2001.

(51) Int. Cl.[7] .............................................. C08F 118/02
(52) U.S. Cl. ...................... 526/319; 526/216; 526/222; 526/256; 526/261; 526/266; 526/320; 526/79
(58) Field of Search ................................. 526/319, 216, 526/222, 256, 261, 266, 320, 79, 56, 202; 528/355, 408; 521/77, 134

(56) References Cited

U.S. PATENT DOCUMENTS

| | | | | |
|---|---|---|---|---|
| 4,533,681 A | * | 8/1985 | Cassatta et al. | 523/400 |
| 4,988,568 A | * | 1/1991 | Hasegawa et al. | 428/402 |
| 5,043,407 A | * | 8/1991 | Hasegawa et al. | 526/307.6 |
| 5,436,284 A | * | 7/1995 | Honda et al. | 523/122 |
| 5,837,790 A | * | 11/1998 | Sojka | 526/323.2 |
| 5,863,996 A | | 1/1999 | Graham | |
| 6,271,273 B1 | * | 8/2001 | You et al. | 521/61 |
| 6,346,592 B1 | * | 2/2002 | S.ae butted.thre et al. | 526/319 |
| 6,420,441 B1 | * | 7/2002 | Allen et al. | 521/77 |
| 6,503,689 B2 | * | 1/2003 | Zampini et al. | 430/270.1 |
| 6,531,535 B2 | * | 3/2003 | Melchiors et al. | 524/457 |
| 6,576,681 B2 | * | 6/2003 | Zampini et al. | 521/77 |

FOREIGN PATENT DOCUMENTS

EP  1 035 183 A1  9/2000

* cited by examiner

Primary Examiner—Tatyana Zalukaeva
(74) Attorney, Agent, or Firm—S. Matthew Cairns

(57) ABSTRACT

Disclosed are methods of preparing solution polymers and compositions derived therefrom.

11 Claims, No Drawings

POLYMER SYNTHESIS AND FILMS THEREFROM

This application claims the benefit of U.S. Provisional Application No. 60/278,904, filed on Mar. 26,2001.

BACKGROUND OF THE INVENTION

The present invention relates generally to the field of polymer synthesis. In particular, the present invention relates to the field of solution polymer synthesis.

Polymers have been prepared by a variety of means such as solution polymerization and emulsion polymerization. Emulsion polymerization is advantageous in that polymer particles having small particle sizes and particle size polydispersities approaching 1 can be prepared. Thus, emulsion particles having a controllable uniform particle size can be prepared. However, emulsion polymers contain surfactants, typically ionic surfactants. For many polymer applications, such as paints, ionic surfactants used during emulsion polymerization pose no problems. However, for other applications, such as those in the electronics industry, such ionic surfactants are problematic.

One application of polymers in the electronics industry is in the formation of porous interlayer dielectric materials used in the manufacture of integrated circuits. As electronic devices become smaller, there is a continuing desire in the electronics industry to increase the circuit density in electronic components, e.g., integrated circuits, circuit boards, multichip modules, chip test devices, and the like without degrading electrical performance, e.g., crosstalk or capacitive coupling, and also to increase the speed of signal propagation in these components. One method of accomplishing these goals is to reduce the dielectric constant of the interlayer, or intermetal, insulating material used in the components. A method for reducing the dielectric constant of such interlayer, or intermetal, insulating material is to incorporate within the insulating film very small, uniformly dispersed pores or voids. Preferred are pores or voids having a diameter of less than or equal to 100 nm.

One known process of making a porous dielectric involves dispersing thermally removable solid particles, i.e. porogens, in a B-staged dielectric precursor, polymerizing the dielectric precursor without substantially removing the particles, followed by heating the dielectric material to substantially remove the particles and thereby leaving voids or free spaces in the dielectric material. Such voids reduce the dielectric constant of the dielectric material. See, for example, U.S. Pat. No. 5,895,263 (Carter et al.).

While other methods of preparing porous dielectric materials are known, they suffer from broad distributions of pore sizes, too large pore size, such as greater than 20 microns, or technologies that are too expensive for commercial use, such as liquid extractions under supercritical conditions.

Solution polymer particles are known. For example, U.S. Pat. No. 5,863,996 (Graham) discloses a solution polymerization process including the steps of (i) polymerizing one or more monomers, the or at least one of which is a cross-linking agent, in a solvent which (a) has a solubility parameter from 2.5 cal$^{1/2}$ ml$^{-3/2}$ below to 1.0 cal$^{1/2}$ ml$^{-3/2}$ above the solubility parameter of the bulk polymeric material and (b) is of the same or adjacent hydrogen bonding group as the bulk polymeric material; (ii) monitoring the polymerization until polymeric material as herein defined is obtained; and (iii) terminating the polymerization before gelation is observed. This patent is directed to the formation of cross-linked, sol-forming particles without gel formation and discloses only particle sizes of no greater than 2 microns. There is no teaching in the '996 patent of how to control particle size, which is important in many applications, nor how to obtain cross-linked polymer particles having a particular particle size. Particularly, nothing in the '996 patent suggests how to prepare polymer particles having a mean particle size ≦20 nanometers.

There is thus a need for polymeric materials suitable for use as porogens to form porous materials, particularly porous dielectric materials, wherein the polymeric particles are substantially free of ionic surfactants and have a mean particle size of ≦20 nanometers.

SUMMARY OF THE INVENTION

It has been surprisingly found that cross-linked solution polymer particles may be prepared having a mean particle size of ≦20 nanometers.

In one aspect, the present invention provides a method of preparing a plurality of cross-linked solution polymer particles including the steps of: a) providing a monomer feed including one or more monomers, and one or more cross-linking agents; b) providing a polymerization initiator feed including a polymerization initiator; c) providing a reaction vessel containing one or more reaction solvents; d) heating the one or more reaction solvents to a temperature sufficient to activate the polymerization initiator; and e) adding the initiator feed and the monomer feed to the reaction vessel at a rate such that the concentration of the one or more monomers in the one or more reaction solvents is substantially constant.

In a second aspect, the present invention provides a plurality of cross-linked solution polymer particles having a mean particle size of ≦30 nm and a particle size polydispersity in the range of 1 to 15.

In a third aspect, the present invention provides a plurality of cross-linked solution polymer particles having a mean particle size of ≦10 nm, wherein the plurality of polymer particles is substantially free of polymer particles having a particle size of 30 nm or greater.

In a fourth aspect, the present invention provides a composition including one or more B-staged dielectric materials and a plurality of cross-linked solution polymers having a mean particle size of ≦30 nm and a particle size polydispersity in the range of 1 to 15.

In a fifth aspect, the present invention provides a composition including one or more B-staged dielectric materials and a plurality of cross-linked solution polymers having a mean particle size of ≦10 nm wherein the plurality of polymer particles is substantially free of polymer particles having a particle size of 30 nm or greater.

In a sixth aspect, the present invention provides a porous dielectric matrix material including a plurality of pores having a mean diameter of ≦5 nm.

In a seventh aspect, the present invention provides an electronic device including one or more layers of porous dielectric matrix material including a plurality of pores having a mean diameter of ≦5 nm.

In an eighth aspect, the present invention provides a method of manufacturing an electronic device including the steps of: a) depositing on a substrate a layer of a composition including B-staged dielectric material having a plurality of cross-linked solution polymeric porogens dispersed therein, wherein the polymeric porogens have a mean particle size of ≦5 nm; b) curing the B-staged dielectric material to form a dielectric matrix material without substantially removing the porogen; c) subjecting the dielectric matrix material to conditions which at least partially remove the porogen to form a porous dielectric material layer without substantially degrading the dielectric material; d) patterning the dielectric layer; e) depositing a metallic film onto the patterned dielectric layer; and f) planarizing the film to form an electronic device.

DETAILED DESCRIPTION OF THE INVENTION

As used throughout this specification, the following abbreviations shall have the following meanings, unless the context clearly indicates otherwise: ° C.=degrees centigrade; nm=nanometer; g=gram; wt %=weight percent; gpc=gel permeation chromatography; L=liter; mL=milliliter; and MAPS=(trimethoxylsilyl)propylmethacrylate.

The term "(meth)acrylic" includes both acrylic and methacrylic and the term "(meth)acrylate" includes both acrylate and methacrylate. Likewise, the term "(meth)acrylamide" refers to both acrylamide and methacrylamide. "Alkyl" includes straight chain, branched and cyclic alkyl groups. The term "porogen" refers to a pore forming material, that is a polymeric material or particle dispersed in a dielectric material that is subsequently removed to yield pores, voids or free volume in the dielectric material. Thus, the terms "removable porogen," "removable polymer" and "removable particle" are used interchangeably throughout this specification. The terms "pore," "void" and "free volume" are used interchangeably throughout this specification. "Cross-linker" and "cross-linking agent" are used interchangeably throughout this specification. "Polymer" refers to polymers and oligomers. The term "polymer" also includes homopolymers and copolymers. The terms "oligomer" and "oligomeric" refer to dimers, trimers, tetramers and the like. "Monomer" refers to any ethylenically or acetylenically unsaturated compound capable of being polymerized. Such monomers may contain one or more double or triple bonds.

The term "B-staged" refers to uncured dielectric matrix materials. By "uncured" is meant any dielectric material that can be polymerized or cured, such as by condensation, to form higher molecular weight materials, such as coatings or films. Such B-staged material may be monomeric, oligomeric or mixtures thereof. B-staged material is further intended to include mixtures of polymeric material with monomers, oligomers or a mixture of monomers and oligomers.

Particle sizes were determined using standard dynamic light scattering techniques. All correlation functions were converted to hydrodynamic sizes using LaPlace inversion methods, such as CONTIN. All amounts are percent by weight and all ratios are by weight, unless otherwise noted. All numerical ranges are inclusive and combinable in any order, except where it is obvious that such numerical ranges are constrained to add up to 100%.

The present invention provides a method of preparing a plurality of cross-linked solution polymer particles including the steps of: a) providing a monomer feed including one or more monomers, and one or more cross-linking agents; b) providing a polymerization initiator feed including a polymerization initiator; c) providing a reaction vessel containing one or more reaction solvents; d) heating the one or more reaction solvents to a temperature sufficient to activate the polymerization initiator; and e) adding the initiator feed and the monomer feed to the reaction vessel at a rate such that the concentration of the one or more monomers in the one or more reaction solvents is substantially constant.

A wide variety of monomers may be used in the present invention. Suitable monomers include, but are not limited to: (meth)acrylic acid, (meth)acrylamides, alkyl (meth) acrylates, alkenyl (meth)acrylates, aromatic (meth)acrylates, vinyl aromatic monomers, nitrogen-containing compounds and their thio-analogs, and substituted ethylene monomers. It is preferred that at least one monomer is selected from meth)acrylic acid, (meth)acrylamides, alkyl (meth)acrylates, alkenyl (meth)acrylates, aromatic (meth)acrylates, vinyl aromatic monomers, nitrogen-containing compounds and their thio-analogs, and substituted ethylene monomers. It will be appreciated by those skilled in the art that more than one monomer may suitable be employed.

Typically, the alkyl (meth)acrylates useful in the present invention are ($C_1$–$C_{24}$) alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates. "Low cut" alkyl (meth) acrylates are typically those where the alkyl group contains from 1 to 6 carbon atoms. Suitable low cut alkyl (meth) acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyleicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy ($C_2$–$C_6$)alkyl (meth)acrylates, dialkylamino ($C_2$–$C_6$)-alkyl (meth)acrylates, dialkylamino($C_2$–$C_6$)alkyl (meth)acrylamides.

Particularly useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$–$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl (meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or "HPMA."

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl) acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of amino ethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl (meth)acrylate such as (trimethoxylsilyl)propylmethacrylate, γ-propyl tri($C_1$–$C_6$) alkylsilyl (meth)acrylate, γ-propyl di($C_1$–$C_6$)alkoxy($C_1$–$C_6$) alkylsilyl (meth)acrylate, γ-propyl di($C_1$–$C_6$)alkyl($C_1$–$C_6$) alkoxysilyl (meth)acrylate, vinyl tri($C_1$–$C_6$)alkoxysilyl (meth)acrylate, vinyl di($C_1$–$C_6$)alkoxy($C_1$–$C_6$)alkylsilyl (meth)acrylate, vinyl ($C_1$–$C_6$)alkoxydi($C_1$–$C_6$)alkylsilyl (meth)acrylate, vinyl tri($C_1$–$C_6$)alkylsilyl (meth)acrylate, and mixtures thereof.

The vinylaromatic monomers useful as unsaturated monomers in the present invention include, but are not limited to: styrene ("STY"), a-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$–$C_{10}$)alkoxy, halo($C_1$–$C_{10}$) alkyl, carb($C_1$–$C_{10}$)alkoxy, carboxy, amino, ($C_1$–$C_{10}$) alkylamino derivatives and the like.

The nitrogen-containing compounds and their thioanalogs useful as unsaturated monomers in the present invention include, but are not limited to: vinylpyridines such as 2-vinylpyridine or 4-vinylpyridine; lower alkyl ($C_1$–$C_8$) substituted N-vinyl pyridines such as 2-methyl-5-vinylpyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinylpyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: allylic monomers, vinyl acetate, vinyl formamide, vinyl chloride, vinyl fluoride, vinyl bromide, vinylidene chloride, vinylidene fluoride and vinylidene bromide.

For certain applications, such as certain electronics applications, particularly useful monomers include silyl containing monomers or poly(alkylene oxide) monomers. Such silyl containing monomers or poly(alkylene oxide) monomers may be used as the monomer or cross-linking agent or both. Any monomer containing silicon may be useful as the silyl containing monomers in the present invention. The silicon moiety in such silyl containing monomers may be reactive or unreactive. Exemplary "reactive" silyl containing monomers include those containing one or more alkoxy or acetoxy groups, such as, but not limited to, trimethoxysilyl containing monomers, triethoxysilyl containing monomers, methyl dimethoxysilyl containing monomers, and the like. Exemplary "unreactive" silyl containing monomers include those containing alkyl groups, aryl groups, alkenyl groups or mixtures thereof, such as but are not limited to, trimethylsilyl containing monomers, triethylsilyl containing monomers, phenyldimethylsilyl containing monomers, and the like. Polymeric particles including silyl containing monomers as polymerized units are intended to include such particles prepared by the polymerization of a monomer containing a silyl moiety. It is not intended to include a linear polymer that contains a silyl moiety only as end capping units. In certain applications, it is preferred that the silyl containing monomer is not a siloxane, thus it is further preferred that the present polymer particle is free of siloxane monomer.

Suitable silyl containing monomers include, but are not limited to, vinyltrimethylsilane, vinyltriethylsilane, vinyltrimethoxysilane, vinyltriethoxysilane, γ-trimethoxysilylpropyl (meth)acrylate, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, allyloxy-tert-butyldimethylsilane, allyloxytrimethylsilane, allyltriethoxysilane, allyltri-isopropylsilane, allyltrimethoxysilane, allyltrimethylsilane, allyltriphenylsilane, diethoxy methylvinylsilane, diethyl methylvinylsilane, dimethyl ethoxyvinylsilane, dimethyl phenylvinylsilane, ethoxy diphenylvinylsilane, methyl bis (trimethylsilyloxy)vinylsilane, triacetoxyvinylsilane, triethoxyvinylsilane, triethylvinylsilane, triphenylvinylsilane, tris(trimethylsilyloxy)vinylsilane, vinyloxytrimethylsilane and mixtures thereof.

The amount of silyl containing monomer useful to form the particles of the present invention is typically from about 1 to about 99% wt, based on the total weight of the monomers used. It is preferred that the silyl containing monomers are present in an amount of from 1 to about 80% wt, and more preferably from about 5 to about 75% wt.

Suitable poly(alkylene oxide) monomers include, but are not limited to, poly(propylene oxide) monomers, poly (ethylene oxide) monomers, poly(ethylene oxide/propylene oxide) monomers, poly(propylene glycol) (meth)acrylates, poly(propylene glycol) alkyl ether (meth)acrylates, poly (propylene glycol) phenyl ether (meth)acrylates, poly (propylene glycol) 4-nonylphenol ether (meth)acrylates, poly(ethylene glycol) (meth)acrylates, poly(ethylene glycol) alkyl ether (meth)acrylates, poly(ethylene glycol) phenyl ether (meth)acrylates, poly(propylene/ethylene glycol) alkyl ether (meth)acrylates and mixtures thereof. Preferred poly (alkylene oxide) monomers include trimethoylolpropane ethoxylate tri(meth)acrylate, trimethoylolpropane propoxylate tri(meth)acrylate, poly(propylene glycol) methyl ether acrylate, and the like. Particularly suitable poly(propylene glycol) methyl ether acrylate monomers are those having a molecular weight in the range of from about 200 to about 2000. The poly(ethylene oxide/propylene oxide) monomers useful in the present invention may be linear, block or graft copolymers. Such monomers typically have a degree of polymerization of from about 1 to about 50, and preferably from about 2 to about 50.

Typically, the amount of poly(alkylene oxide) monomers useful in the particles of the present invention is from about 1 to about 99% wt, based on the total weight of the monomers used. The amount of poly(alkylene oxide) monomers is preferably from about 2 to about 90% wt, and more preferably from about 5 to about 80% wt.

A wide variety of cross-linking agents may be used in the present invention. Any amount of cross-linker is suitable for use in the present invention. Typically, the polymers of the present invention contain at least 1% by weight, based on the total weight of the polymer. Up to and including 100% cross-linking agent, based on the weight of the polymer, may be effectively used in the particles of the present invention. It is preferred that the amount of cross-linker is from 1 to 80%, more preferably from 1 to 60%, and still more preferably from 1 to 30%. In certain polymeric systems, high amount of cross-linking agent, such as greater than about 30%, may cause gel formation, particularly in systems containing silyl monomers.

Suitable cross-linkers useful in the present invention include di-, tri-, tetra-, or higher multi-functional ethylenically unsaturated monomers. Examples of cross-linkers useful in the present invention include, but are not limited to: trivinylbenzene, divinyltoluene, divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, divinyl silane,. trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly (phenyl vinyl siloxane) and mixtures thereof.

The present polymerizations may be anionic polymerization or free radical polymerization. It is preferred that the polymerization is free radical. Initiators useful in the free radical polymerization of porogens of the present invention include, but are not limited to, one or more of: peroxyesters, dialkylperoxides, alkylhydroperoxides, persulfates, azoinitiators, redox initiators and the like. Particularly useful free radical initiators include, but are not limited to: benzoyl peroxide, tert-butyl peroctoate, tert-amyl peroxypivalate, cumene hydroperoxide, and azo compounds such as azoisobutylnitrile and 2,2'-azobis (2-methylbutanenitrile). When such free radical initiators are used, part of the initiator is incorporated into the polymer as end groups. It is preferred that the free radical initiator is tert-amyl peroxypivalate or benzoyl peroxide. The amount of the free radical initiator used is typically from 0.05 to 10% by weight, based on the weight of total monomer. It will be appreciated that more than one polymerization initiator may be used.

Chain transfer reagents may optionally be used to prepare the polymers useful in the present invention. Suitable chain transfer agents include, but are not limited to: alkyl mercaptans such as dodecyl mercaptan, and aromatic hydrocarbons with activated hydrogens such as toluene. Such optional chain transfer agents are typically added to the monomer feed. When the present cross-linked polymer particles are used in electronic applications, it is preferred that the optional chain transfer agent is not a sulfur-containing chain transfer agent.

The monomer feed is prepared by combining the one or more monomers and one or more cross-linking agents in any order. Such monomer feed may optionally include one or more solvents. Preferably, the optional solvents are those used in the reaction vessel. Such solvents, when used, are typically used in relatively small amounts, but may be used in larger amounts.

The polymerization initiator feed includes one or more polymerization initiators. When a separate polymerization initiator feed is used, it preferably includes one or more solvents. Suitable solvents are those described for use in the reaction vessel. Preferably, the solvents are those used in the reaction vessel.

The optional chain transfer agents may be added to the monomer feed, polymerization initiator feed, the solvents in the reaction vessel or any combination thereof.

In an alternate embodiment, the monomer feed and the polymerization initiator feed may be combined prior to being added to the reaction vessel. Such combination may be by combining the two feeds into a single feed or by preparing only one feed including one or more monomers, one or more cross-linking agents, polymerization initiator, optional one or more solvents and optional chain transfer agent in any order.

In the present method, both the monomer feed and the polymerization initiator feed are added to a polymerization reaction vessel containing one or more organic solvents. Prior to the addition of the monomer and polymerization initiator feeds, the organic solvents in the reaction vessel are heated to a temperature sufficient to activate the polymerization initiator, i.e. initiate polymerization. The specific temperature used depends upon the particular polymerization initiator used. Such activation or decomposition temperatures of the polymerization initiators are well known in the art. Thus, the specific temperature selected is within the ability of one skilled in the art. Typically, the temperature of the solvents is from 50° to 130° C., and preferably from 55° to 125° C. For example, the temperature of the one or more solvents is selected such that the ½ life of the polymerization initiator is in the range of 1 minute to 4 hours, preferably from 5 to 60 minutes, and preferably from 10 to 45 minutes. It will be appreciated that the ½ life of the initiator may be longer than 60 minutes.

A wide variety of solvents may be used in the present invention. By "solvent" is meant organic solvents. Exemplary solvents include, but are not limited to, hydrocarbons, such as alkanes, fluorinated hydrocarbons, and aromatic hydrocarbons, ethers, ketones, esters, alcohols and mixtures thereof. Particularly suitable solvents include dodecane, mesitylene, xylenes, diphenyl ether, gamma-butyrolactone, ethyl lactate, propyleneglycol monomethyl ether acetate, caprolactone, 2-hepatanone, cyclohexanone, methylisobutyl ketone, diisobutylketone, propyleneglycol monomethyl ether, decanol, and t-butanol.

Typically, the monomer feed is added to the heated solvent at a rate such that the concentration of the one or more monomers in the one or more reaction solvents is substantially constant. While not intending to be bound by theory, it is believed that the one or more monomers and one or more cross-linkers are polymerized at a rate that is substantially equal to the rate of addition of the monomers to the solvent. Thus, it is believed that the concentration of monomer in the reaction solvent does not build up over the course of the polymerization. The present polymerization is thus performed under conditions of high dilution, i.e. extremely high instantaneous solvent to monomer ratios. Such high dilution conditions provide considerable improvement over conventional methods in that monitoring of the reaction is unnecessary and gel formation is substantially reduced or eliminated. Thus, the present polymerizations may be carried out to the end of the polymerization with significantly reduced gel formation or no gel formation at all.

The polymerization initiator feed, when added separately, may be added to the reaction vessel at a variety of rates. In one embodiment, the polymerization initiator feed is added at substantially the same rate as the monomer feed. The polymerization initiator feed is added at a rate to provide at least sufficient polymerization initiator to the reaction vessel so as to cause polymerization of the one or more monomers such that the concentration of the one or more monomers in the reaction vessel is substantially constant over the course of the polymerization reaction.

After completing the monomer feed addition, a series of additional aliquots of polymerization initiator in solvent may be charged to the reaction. Typically, the initiator is charged to the reaction and followed by a hold period to allow for reaction to occur before adding the next initiator amount. Typically three initiator additions are used. In an alternative embodiment, a chaser feed may be used in place of, or in addition to, the initiator shots. Such chaser feed is particularly suitable when the initiator feed is separately charged to the reaction vessel. After the final initiator amount is added the reaction mixture is held for 30 minutes to 4 hours to fully decompose all initiator and drive the reaction to completeness.

Upon completion of the polymerization reaction, the reaction solvent contains a plurality of cross-linked solution polymer particles. Such particles may be used in solution or isolated by any conventional means. Typically, the molecular weight of the present cross-linked solution polymer particles is in the range of 5,000 to 1,000,000, preferably 10,000 to 500,000, and more preferably 10,000 to 100,000.

It has been surprisingly found that cross-linked solution polymer particles of the present invention may be prepared in a wide range or particle sizes according to the present invention. Typically, the plurality of polymer particles of the present invention has a mean particle size of $\leq 100$ nm, preferably $\leq 50$ nm, and more preferably $\leq 40$ nm. Other pluralities of the present polymer particles have a mean particle size of $\leq 30$ nm, $\leq 25$ nm, $\leq 20$ nm, $\leq 15$ nm, or $\leq 10$ nm. Particularly suitable pluralities of polymer particles have a mean particle size of $\leq 8$ nm, $\leq 5$ nm, $\leq 3$ nm or $\leq 2$ nm. Pluralities of polymer particles having mean particle sizes in the range of 0.75 to 1 nmn can also be prepared according to the present invention. Suitable ranges of mean particle size are from 0.75 to 100 nm, preferably from 0.75 to 50 nm, more preferably from 1 to 30 nm, still more preferably from 1 to 20 nm, and most preferably from 1 to 10 nm.

An advantage of the present invention is that narrow distributions of particle sizes are obtained. Polydispersity is a well-known measure of the particle size distribution of a plurality of polymer particles. Polydispersity ("PD") as used herein is calculated from the weight average size, $d_w$, and the number average size, $d_n$, by the formulae:

$PD=(d_w)/(d_n)$ $d_n = \Sigma n_i d_i / \Sigma n_i$ $d_w = \Sigma n_i d_i d_i / \Sigma n_i d_i$ where $n_i$ is the number of particles having the particle size $d_i$. According to the present invention, particles may be prepared having a particle size polydispersity in the range of 1 to 15, preferably 1 to 10, more preferably 1 to 7, and still more preferably 1 to 5. Narrower polydispersities may be prepared by using chain transfer agents.

Small polymer particles, such as those having a mean particle size $\leq 30$ nm, having narrow polydispersities may be prepared according to the present invention. Thus, the present invention provides a plurality of cross-linked solution polymer particles having a mean particle size of $\leq 30$ nm and a particle size polydispersity in the range of 1 to 15. It is preferred that the particles have a mean particle size of $\leq 20$ nm, more preferably $\leq 10$ nm, and still more preferably $\leq 5$ nm.

The present polymer particles may be prepared in any size tailored to the desired application. Such particle sizes may be tailored or adjusted by changing the dilution of the monomers during the polymerization reaction, the temperature of the reaction, or both. For example, larger particles may be obtained by increasing the concentration of the monomers in the reaction vessel during the course of the polymerization. Likewise, by decreasing the concentration (i.e., increasing the dilution) of the monomers, particles having smaller particle sizes may be prepared.

Another advantage of the present invention is that polymer particles may be prepared that are substantially free of large or very large particles. In particular, pluralities of polymer particles may be prepared according to the present invention that are substantially free of particles having a particle size of 100 nm or greater, 50 nm or greater, 30 nm or greater or 20 nm or greater. Such pluralities being substantially free of larger or very large particles are particularly useful for applications requiring substantially uniformly sized, small polymer particles, such as in the manufacture of porous dielectric materials for the electronics industry. Thus, the present invention provides a plurality of cross-linked solution polymer particles having a mean particle size of $\leq 10$ nm, wherein the plurality of polymer particles is substantially free of polymer particles having a particle size of 30 nm. Preferably, the particles have a mean particle size of $\leq 5$ nm. It is further preferred that the particles are substantially free of polymer particles having a particle size of 20 nm.

The polymer particles of the present invention are suitable for a variety of uses. Suitable uses are any where conventional solution polymer particles are used, such as in coatings such as paints, varnishes, and the like; adhesives; construction products such as mastics, caulks, sealants, and the like; polishes; waxes; electronic applications such as in photoresists, plating resists, soldermasks, antireflective coatings, and as porogens for use in forming porous materials; and optoelectronic applications such as coatings, films, and for attenuating the refractive index of materials such as waveguides, optical switches, and the like.

The cross-linked solution polymer particles of the present invention are useful as porogens in reducing the dielectric constant of dielectric materials, particularly low dielectric constant ("k") materials. A low k dielectric material is any material having a dielectric constant less than 4. Suitable dielectric materials useful in the present invention include, but are not limited to: inorganic matrix materials such as carbides, oxides, nitrides and oxyfluorides of silicon, boron, or aluminum; silicones; siloxanes, such as silsesquioxanes; silicates; silazanes; and organic matrix materials such as benzocyclobutenes, poly(aryl esters), poly(ether ketones), polycarbonates, polyimides, fluorinated polyimides, polynorbornenes, poly(arylene ethers), polyaromatic hydrocarbons, such as polynaphthalene, polyquinoxalines, poly(perfluorinated hydrocarbons) such as poly (tetrafluoroethylene), and polybenzoxazoles. Particularly suitable dielectric materials are available under the tradenames TEFLON, AVATREL, BCB, AEROGEL, XEROGEL, PARYLENE F, and PARYLENE N. Suitable silsesquioxane compositions include, but are not limited to hydrogen silsesquioxane, alkyl silsesquioxane such as methyl silsesquioxane, aryl silsesquioxane such as phenyl silsesquioxane, and mixtures thereof, such as alkyl/ hydrogen, aryl/hydrogen or alkyl/aryl silsesquioxane. It is preferred that the dielectric material is a silsesquioxane and more preferably hydrogen silsesquioxane, methyl silsesquioxane, phenyl silsesquioxane, a mixture of dielectric materials containing hydrogen silsesquioxane as a predominant component, or mixtures thereof Such dielectric materials are commercially available or may be prepared by known methods. For example the preparation of hydrogen silsesquioxanes is disclosed in U.S. Pat. No. 3,615,272. Typically, the silsesquioxanes useful in the present invention are used as oligomeric materials, generally having from 8 to 20 repeating units.

Preferred dielectric materials are B-staged organo polysilica materials. By B-staged organo polysilica (or organo siloxane) is meant a compound including silicon, carbon, oxygen and hydrogen atoms and having the formula:

wherein R, $R^1$, $R^2$ and $R^3$ are independently selected from hydrogen, $(C_1–C_6)$alkyl, aryl, and substituted aryl; a, c and d are independently a number from 0 to 1; b is a number from 0.2 to 1; n is integer from about 3 to about 10,000; provided that a+b+c+d=1; and provided that at least one of R, $R^1$ and $R^2$ is not hydrogen. "Substituted aryl" refers to an aryl group having one or more of its hydrogens replaced by another substituent group, such as cyano, hydroxy, mercapto, halo, $(C_1–C_6)$alkyl, $(C_1–C_6)$alkoxy, and the like. In the above formula, a, b, c and d represent the mole ratios of each component. Such mole ratios can be varied between 0 and about 1. It is preferred that a is from 0 to about 0.8. It is also preferred that c is from 0 to about 0.8. It is further preferred that d is from 0 to about 0.8. In the above formula, n refers to the number of repeat units in the B-staged material. Preferably, n is an integer from about 3 to about 1000. It will be appreciated that prior to any curing step, the B-staged organo polysilica dielectric matrix materials may include one or more of hydroxyl or alkoxy end capping or side chain functional groups. Such end capping or side chain functional groups are known to those skilled in the art.

When used as porogens, the present polymer particles may be directly added to a B-staged dielectric matrix material as is or may be first purified to remove impurities that might affect the electrical or physical properties of electronic devices. Purification of the porogen particles may be accomplished either by precipitation of the porogen particles or adsorption of the impurities.

In preparing the dielectric matrix materials of the present invention, the porogens are first dispersed within, or dissolved in, a B-staged dielectric material. Any amount of porogen may be combined with the B-staged dielectric materials according to the present invention. The amount of porogen used will depend on the particular porogen employed, the particular B-staged dielectric material employed, and the extent of dielectric constant reduction desired in the resulting porous dielectric material. Typically, the amount of porogen used is in the range of from 1 to 90 wt %, based on the weight of the B-staged dielectric material, preferably from 10 to 80 wt %, more preferably from 15 to 60 wt %, and even more preferably from 20 to 30 wt %. Typically, the B-staged matrix material is first dissolved in a suitable high boiling solvent, such as methyl isobutyl ketone, diisobutyl ketone, 2-heptanone, γ-butyrolactone, γ-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'-dimethylpropyleneurea, mesitylene, xylenes, or mixtures thereof to form a solution. The porogen particles are then dispersed or dissolved within the solution. The resulting dispersion is then deposited on a substrate by methods known in the art, such as spin coating, spray coating or doctor blading, to form a film or layer.

Preferably, when used as porogens the cross-linked solution polymer particles have a mean particle size of $\leq 30$ nm, more preferably ≦20 nm, still more preferably ≦10 nm, and even more preferably ≦5 nm. Particularly suitable particle sizes are ≦3 nm or ≦2 nm. Thus, the present invention still further provides a composition including one or more B-staged dielectric materials and a plurality of cross-linked solution polymers having a mean particle size of ≦30 nm and a particle size polydispersity in the range of 1 to 15.

In an alternate embodiment, it is preferred that the present polymer particles used as porogens are substantially free of large or very large particles, such as 30 nm or greater, 20 nm or greater or even 20 nm or greater. Thus, the present invention further provides a composition including one or more B-staged dielectric materials and a plurality of cross-linked solution polymers having a mean particle size of ≦10 nm, wherein the plurality of polymer particles is substantially free of polymer particles having a particle size of 30 nm or greater. Preferably, the mean particle size is ≦5 nm, more preferably ≦3 nm, and still more preferably ≦2 nm.

After being deposited on a substrate, the B-staged dielectric material is then substantially cured to form a rigid, cross-linked dielectric matrix material without substantially removing the porogen particle. Such curing may be by any means known in the art including, but not limited to, heating to induce condensation or e-beam irradiation to facilitate free radical coupling of the oligomer or monomer units.

Once the B-staged dielectric material is cured, the film is subjected to conditions which remove the porogen without substantially degrading the dielectric matrix material, that is, less than 5% by weight of the dielectric matrix material is lost. Typically, such conditions include exposing the film to heat and/or radiation and are within the ability of one skilled in the art. Upon removal, the porogen polymer depolymerizes or otherwise breaks down into volatile components or fragments which are then removed from, or migrate out of, the dielectric matrix material yielding pores or voids, which fill up with the carrier gas used in the process. Thus, a porous dielectric material having voids is obtained, where the size of the voids is substantially the same as the particle size of the porogen. The resulting dielectric material having voids thus has a lower dielectric constant than such material without such voids.

Thus, the present invention further provides a porous dielectric matrix material including a plurality of pores having a mean diameter of ≦5 nm, preferably ≦3 nm, and more preferably ≦2 nm. In yet another embodiment, the present invention provides an electronic device including one or more layers of porous dielectric matrix material including a plurality of pores having a mean diameter of ≦5 nm.

The present particles may also be post-functionalized. Such post-functionalization may be advantageous, such as in further compatiblizing the porogen with the dielectric material and may be by any techniques known in the art. It is preferred that when the polymer particles of the present invention are used as porogens, that they are substantially compatible with the dielectric material.

In general, the cross-linked solution polymer particles of the present invention useful as porogens must be dispersible, miscible or otherwise substantially compatible with the host dielectric matrix material in solution and in the thin film. Preferably, the porogen must be present within this solution as substantially discrete, substantially non-aggregated or substantially non-agglomerated particles in order to achieve the desired benefit of this invention, namely substantially uniformly dispersed pores with a size comparable to that of the porogen's size. This is accomplished by modifying the porogen composition such that it is "compatible" with the host dielectric matrix material. Such compatibilization is described in copending U.S. patent application Ser. No. 09/460,326 (Allen et al.).

In a further embodiment, the present invention provides a method of manufacturing an electronic device including the steps of: a) depositing on a substrate a layer of a composition including B-staged dielectric material having a plurality of cross-linked solution polymeric porogens dispersed therein, wherein the polymeric porogens have a mean particle size of ≦5 nm; b) curing the B-staged dielectric material to form a dielectric matrix material without substantially removing the porogen; c) subjecting the dielectric matrix material to conditions which at least partially remove the porogen to form a porous dielectric material layer without substantially degrading the dielectric material; d) patterning the dielectric layer; e) depositing a metallic film onto the patterned dielectric layer; and f) planarizing the film to form an electronic device. Preferably, the porogen is substantially compatible with the B-staged dielectric material.

The porous dielectric material may be lithographically patterned by a variety of means known in the art, such as by using photoresists. Such patterning typically forms vias and/or trenches in subsequent processing steps. The trenches generally extend to the substrate and connect to at least one metallic via. Typically, lithographic patterning involves (i) coating the dielectric material layer with a positive or negative photoresist, such as those marketed by Shipley Company (Marlborough, Mass.); (ii) imagewise exposing, through a mask, the photoresist to radiation, such as light of appropriate wavelength or e-beam; (iii) developing the image in the resist, e.g., with a suitable developer; and (iv) transferring the image through the dielectric layer to the substrate with a suitable transfer technique such as reactive ion beam etching. Optionally, an antireflective composition may be disposed on the dielectric material prior to the photoresist coating. Such lithographic patterning techniques are well known to those skilled in the art.

A metallic film is then deposited onto the patterned dielectric layer to fill the trenches. Preferred metallic materials include, but are not limited to: copper, tungsten, gold, silver, aluminum or alloys thereof. The metal is typically deposited onto the patterned dielectric layer by techniques well known to those skilled in the art. Such techniques include, but are not limited to: chemical vapor deposition ("CVD"), plasma-enhanced CVD, combustion CVD ("CCVD"), electro and electroless deposition, sputtering, or the like. Optionally, a metallic liner, such as a layer of nickel, tantalum, titanium, tungsten, or chromium, including nitrides or silicides thereof, or other layers such as barrier or adhesion layers, e.g. silicon nitride or titanium nitride, is deposited on the patterned and etched dielectric material.

Excess metallic material is removed, e.g. by planarizing the metallic film, so that the resulting metallic material is generally level with the patterned dielectric layer. Planarization is typically accomplished with chemical/mechanical polishing or selective wet or dry etching. Such planarization methods are well known to those skilled in the art.

It will be appreciated by those skilled in the art that multiple layers of dielectric material, including multiple layers of porous dielectric material, and metal layers may subsequently be applied by repeating the above steps. It will be further appreciated by those skilled in the art that the compositions of the present invention are useful in any and all methods of integrated circuit manufacture.

In another embodiment, the present invention provides an optoelectronic device comprising a plurality of polymer particles having a mean diameter of ≦5 nm. In yet another embodiment, the present invention provides an optoelectronic device including one or more layers of porous material including a plurality of pores having a mean diameter of ≦5 nm.

The following examples are presented to illustrate further various aspects of the present invention, but are not intended to limit the scope of the invention in any aspect.

EXAMPLE 1

2-Ethylhexyl acrylate/trimethylolpropane triacrylate (EHA/TMPTMA) copolymer was formed via solution polymerization. A 500 mL reactor was fitted with a thermocouple, a temperature controller, a purge gas inlet, a water-cooled reflux condenser with purge gas outlet, a stirrer, and an addition funnel. To the addition funnel was charged 20.40 g of a monomer mixture consisting of 18.00 g 2-ethylhexyl acrylate (100% purity), 2.00 g trimethylolpropane triacrylate (100% purity), 0.40 g of a 75% solution of tert-amyl peroxypivilate in mineral spirits (Luperox 554-M-75). The reactor, containing 108.73 g methyl isobutylketone (MIBK) was then flushed with nitrogen for 30 minutes before applying heat to bring the contents of the reactor to 82° C. When the contents of the reactor reached 82° C., the monomer mixture in the addition funnel was uniformly charged to the reactor over 90 minutes. Thirty minutes after the end of the monomer mixture addition, the first of three chaser shots, spaced thirty minutes apart and consisting of 0.40 g of a 75% solution of tert-amyl peroxypivilate in mineral spirits and 1.00 g MIBK, was made. At the end of the third chaser shot the contents of the reactor were held 2 hours at 82° C. to complete the reaction. The nanoparticles thus formed had a particle size distribution of approximately 2.2–5.1 nm by gpc. The mean particle size was 2.2 nm, the largest particle size was 5.1 nm and the particle size polydispersity was 2.3.

EXAMPLE 2 (COMPARATIVE)

2-Ethylhexyl acrylate/trimethylolpropane triacrylate (EHA/TMPTMA) copolymer was formed via solution polymerization using a conventional one-pot reaction. A 500 mL reactor was fitted with a thermocouple, a temperature controller, a purge gas inlet, a water-cooled reflux condenser with purge gas outlet, and a stirrer. To the reactor was charged 128.73 g of a monomer mixture consisting of 18.00 g 2-ethylhexyl acrylate (100% purity), 2.00 g trimethylolpropane triacrylate (100% purity), and 108.73 g methyl isobutylketone (MIBK). The reactor was then flushed with nitrogen for 30 minutes before applying heat to bring the contents of the reactor to 82° C. When the contents of the reactor reached 82° C., 0.40 g of a 75% solution of tert-amyl peroxypivilate in mineral spirits (Luperox 554-M-75) was added as a single shot to initiate polymerization. Thirty minutes after the initiator addition, the first of three chaser shots, spaced thirty minutes apart and consisting of 0.40 g of a 75% solution of tert-amyl peroxypivilate in mineral spirits and 1.00 g MIBK, was made. At the end of the third chaser shot the contents of the reactor were held 2 hours at 82° C. to complete the reaction. The nanoparticles thus formed (Comparative) had a particle size distribution of approximately 1.7–28.3 nm by gpc. The mean particle size was 1.7 nm, the largest particle was 28.3 nm and the particle size polydispersity was 16.6.

EXAMPLES 3–21

The following cross-linked solution polymer particles were prepared according to the general procedure of Example 1, except that the ratio of EHA to TMPTMA varied, along with the theoretical solids percentage of the reaction particular reactants and their amounts varied, as reported in the Table 1.

TABLE 1

| Example | EHA/TMPTMA Ratio | Polymerization Initiator (%) | Solids Theoretical Percentage | Mean Particle Size (nm) | Largest Particle Size (nm) | Particle Size Polydispersity |
|---|---|---|---|---|---|---|
| 3 | 60/40 | 2 | 15 | macro gel | — | — |
| 4 | 60/40 | 2 | 5 | 28.8 | 45.4 | 1.6 |
| 5 | 70/30 | 2 | 15 | 0.97 | 48.5 | 49.9 |
| 6 | 70/30 | 2 | 5 | 0.95 | 38.8 | 41 |
| 7 | 80/20 | 2 | 15 | 4.0 | 47.2 | 11.8 |
| 8 | 80/20 | 2 | 5 | 0.98 | 9.21 | 9.4 |
| 9 | 80/20 | 1 | 15 | 4.4 | 20.0 | 4.6 |
| 10 | 80/20 | 1 | 12.5 | 4.5 | 18.3 | 4.1 |
| 11 | 80/20 | 1 | 10 | 3.1 | 13.4 | 4.4 |
| 12 | 80/20 | 1 | 7.5 | 5.0 | 11.2 | 2.2 |
| 13 | 85/15 | 2 | 20 | 4.2 | 15.1 | 3.6 |
| 14 | 85/15 | 2 | 15 | 4.0 | 9.0 | 2.3 |
| 15 | 85/15 | 2 | 10 | 1.7 | 7.2 | 4.2 |
| 16 | 85/15 | 2 | 5 | 1.0 | 6.5 | 6.4 |
| 17 | 90/10 | 2 | 25 | 3.5 | 8.7 | 2.5 |
| 18 | 90/10 | 2 | 20 | 2.5 | 5.9 | 2.4 |
| 19 | 90/10 | 2 | 15 | 2.4 | 4.8 | 2.0 |
| 20 | 90/10 | 2 | 20 | 2.5 | 5.9 | 2.4 |
| 21 | 90/10 | 2 | 25 | 3.5 | 8.7 | 2.5 |

EXAMPLES 22–32

The procedure of Example 1 was repeated except that the monomers were MMA and MAPS and the cross-linking agent was DEGDMA or DVB. The weight average ("Mw") and number average ("Mn") molecular weights of the resulting polymers were determined. The results are reported in Table 2.

TABLE 2

| Example | Monomer Ratio | Initiator (%) | Solids Theoretical Percentage | Mw | Mn |
|---|---|---|---|---|---|
| 22 | MMA/MAPS/DEGDMA 80/10/10 | 2 | 40 | macro gel | — |
| 23 | MMA/MAPS/DEGDMA 80/10/10 | 2 | 30 | macro gel | — |
| 24 | MMA/MAPS/DEGDMA 80/10/10 | 2 | 15 | 111,000 | 10,200 |
| 25 | MMA/MAPS/DEGDMA 80/10/10 | 8 | 10.1 | 25,000 | 8600 |
| 26 | MMA/MAPS/DEGDMA 80/10/10 | 8 | 5.2 | 19,500 | 8800 |
| 27 | MMA/MAPS/DVB 10/60/30 | 2 | 30 | gel | — |
| 28 | MMA/MAPS/DVB 10/60/30 | 2 | 10 | 95,600 | 12,000 |
| 29 | MMA/MAPS/DVB 20/60/20 | 2 | 30 | gel | — |
| 30 | MMA/MAPS/DVB 20/60/20 | 2 | 15 | gel | — |
| 31 | MMA/MAPS/DVB 20/60/20 | 2 | 10 | 469,900 | 30,900 |
| 32 | MMA/MAPS/DVB 20/60/20 | 2 | 5 | 110,400 | 19,800 |

EXAMPLE 33

The procedure of Example 1 was repeated using EHA and TMPTMA in a 90/10 ratio at a 15% theoretical solids level using 2% of polymerization initiator, except that the temperature of the reaction vessel varied. The results are reported in Table 3.

TABLE 3

| Sample | Temperature (° C.) | Mean Particle Size (nm) | Largest Particle Size (nm) | Particle Size Polydispersity |
|---|---|---|---|---|
| A | 77 | 4.1 | 6.4 | 1.6 |
| B | 82 | 2.3 | 5.1 | 2.2 |
| C | 82 | 2.4 | 4.8 | 2.0 |
| D | 82 | 2.2 | 5.1 | 2.3 |
| E | 87 | 2.4 | 4.2 | 1.8 |
| F | 95 | 1.9 | 3.5 | 1.8 |

The above data clearly show that as the temperature of the solvent in the reaction vessel increases (i.e. the ½ life of the polymerization initiator decreases), the smaller the mean particle size and the narrower the polydispersity of the resulting cross-linked polymer particles. Thus, small, uniformly sized particles can be obtained by the process of the present invention.

EXAMPLE 34

The procedure of Example 1 was repeated except that different reactants, different ratios of reactants and different reaction solvents were used. In each case, the polymerization initiator was 2%. The solvent used in samples 34A–34C was cyclohexanone. The solvent in samples 34D–34N was MIBK. The results are reported in Table 4.

TABLE 4

| Sample | Monomers | Monomer Ratio | Solids Theoretical Percentage | Mean Particle Size (nm) | Largest Particle Size (nm) | Particle Size Polydispersity |
|---|---|---|---|---|---|---|
| A | STY/DVB | 90/10 | 15 | 3.1 | 12.8 | 4.2 |
| B | STY/DVB | 92.5/7.5 | 15 | 12.7 | 19.3 | 1.5 |
| C | STY/DVB | 95/5 | 15 | 7.2 | 29.2 | 4.0 |
| D | EHA/TMPTMA | 60/40 | 5 | 28.8 | 45.4 | 1.6 |
| E | EHA/TMPTMA | 70/30 | 5 | 0.95 | 38.8 | 41.0 |
| F | EHA/TMPTMA | 80/20 | 5 | 0.98 | 9.21 | 9.4 |
| G | EHA/TMPTMA | 85/15 | 5 | 1.0 | 6.48 | 6.4 |
| H | EHA/TMPTMA | 60/40 | 15 | gel | — | — |
| I | EHA/TMPTMA | 70/30 | 15 | 0.97 | 48.5 | 50.0 |
| J | EHA/TMPTMA | 80/20 | 15 | 4.0 | 47.2 | 11.8 |
| K | EHA/TMPTMA | 85/15 | 15 | 4.0 | 9.0 | 2.3 |
| L | EHA/TMPTMA | 90/10 | 15 | 2.2 | 5.1 | 2.3 |
| M | EHA/TMPTMA | 85/15 | 20 | 4.2 | 15.1 | 3.6 |
| N | EHA/TMPTMA | 90/10 | 20 | 2.5 | 5.9 | 2.4 |

What is claimed is:

1. A method of preparing a plurality of cross-linked solution polymer particles comprising the steps of: a) providing a monomer feed comprising one or more ethylenically or acetylenically unsaturated monomers, and one or more multi-ethylenically unsaturated cross-linking agents; b) providing a polymerization initiator feed comprising a polymerization initiator; c) providing a reaction vessel containing one or more reaction solvents; d) heating the one or more reaction solvents to a temperature sufficient to activate the polymerization initiator; and then e) adding the initiator feed and the monomer feed to the reaction vessel at a rate such that the concentration of the one or more monomers in the one or more reaction solvents is substantially constant to provide the cross-linked solution polymer particles having a mean particle size of 0.75 to 100 nm.

2. The method of claim 1 wherein the monomer feed and the polymerization initiator feed are combined prior to being added to the reaction vessel.

3. The method of claim 1 wherein the polymerization initiator feed further comprises one or more solvents.

4. The method of claim 1 wherein the polymerization initiator is a free radical initiator.

5. The method of claim 4 wherein the free radical initiator is selected from the group consisting of peroxyesters, dialkylperoxides, alkylhydroperoxides, persulfates, azoinitiators and redox initiators.

6. The method of claim 1 wherein at least one monomer is selected from the group consisting of (meth)acrylic acid, (meth)acrylaniides, alkyl (meth)acrylates, alkenyl (meth) acrylates, aromatic (meth)acrylates, vinyl aromatic monomers, nitrogen-containing compounds, thio-analogs of nitrogen containing compounds and substituted ethylene monomers.

7. The method of claim 1 wherein at least one monomer is selected from the group consisting of silyl containing monomers and poly(alkylene oxide) monomers.

8. The method of claim 1 wherein the one or more cross-linking agents is selected from the group consisting of trivinylbenzene, divinyltoluene, divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate, ethyleneglycol dimethacrylate, diethyleneglycol dimethacrylate, propyleneglycol dimethacrylate, propyleneglycol diacrylate, trimethyloipropane trimethacrylate, divinyl benzene, glycidyl methacrylate, 2,2-dimethyipropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethyloipropane triethoxy triacrylate, glyceryl propoxy triacrylate, pentaerythritol tetraacrylate, pentaerythritol tetramethacrylate, dipentaerythritol monohydroxypentaacrylate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), and poly (phenyl vinyl siloxane).

9. A method of preparing a plurality of cross-linked solution polymer particles comprising the steps of: a) providing a monomer feed comprising one or more ethylenically or acetylenically unsaturated monomers, and one or more multi-ethylenically unsaturated cross-linking agents;

b) providing a polymerization initiator feed comprising a free radical polymerization initiator; c) providing a reaction vessel containing one or more reaction solvents; d) heating the one or more reaction solvents to a temperature sufficient to activate the polymerization initiator; and then e) adding the initiator feed and the monomer feed to the reaction vessel at a rate such that the concentration of the one or more monomers in the one or more reaction solvents is substantially constant to provide the cross-linked solution polymer particles; wherein the cross-linked polymer particles have a mean particle size of 0.75 to 100 nm and a particle size polydispersity of from 1 to 15.

10. The method of claim 9 wherein at least one monomer is selected from the group consisting of (meth)acrylic acid, (meth)acrylamides, alkyl (meth)acrylates, alkenyl (meth)acrylates, aromatic (meth)acrylates, vinyl aromatic monomers, nitrogen-containing compounds, thio-analogs of nitrogen containing compounds and substituted ethylene monomers.

11. The method of claim 9 wherein the monomer feed and the polymerization initiator feed are combined prior to being added to the reaction vessel.

* * * * *